(12) United States Patent
Viotto et al.

(10) Patent No.: US 12,216,178 B2
(45) Date of Patent: Feb. 4, 2025

(54) FAIL-SAFE OPERATING METHOD FOR A DECENTRALIZED POWER GENERATION PLANT

(71) Applicant: SMA Solar Technology AG, Niestetal (DE)

(72) Inventors: Michael Viotto, Kassel (DE); Martin Putz, Kassel (DE); Christian Tschendel, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 29 days.

(21) Appl. No.: 17/838,630

(22) Filed: Jun. 13, 2022

(65) Prior Publication Data

US 2022/0373613 A1 Nov. 24, 2022

Related U.S. Application Data

(63) Continuation of application No. 16/893,276, filed on Jun. 4, 2020, now Pat. No. 11,360,157, which is a (Continued)

(30) Foreign Application Priority Data

Dec. 6, 2017 (DE) .................... 10 2017 129 083.4

(51) Int. Cl.
*G01R 31/52* (2020.01)
*G01R 31/64* (2020.01)
(Continued)

(52) U.S. Cl.
CPC ............. *G01R 31/52* (2020.01); *G01R 31/64* (2020.01); *G01W 1/10* (2013.01); *H02J 3/004* (2020.01)

(58) Field of Classification Search
CPC ......... G01R 31/52; G01R 31/64; G01W 1/10; H02J 3/004; H02S 50/00; H02H 11/005; H02H 3/006; H02H 3/337; H02H 7/20
See application file for complete search history.

(56) References Cited

U.S. PATENT DOCUMENTS

| 6,107,560 A | 8/2000 | Takehara | |
| 2004/0207366 A1* | 10/2004 | Sung | H02J 7/35 320/140 |

(Continued)

FOREIGN PATENT DOCUMENTS

| DE | 102015101870 A1 | 8/2015 |
| JP | H09285015 A | 10/1997 |

(Continued)

OTHER PUBLICATIONS

International Search Report dated Mar. 6, 2019 in connection with PCT/EP2018/083229.
(Continued)

*Primary Examiner* — Lee E Rodak
*Assistant Examiner* — Demetrius R Pretlow
(74) *Attorney, Agent, or Firm* — Eschweiler & Potashnik, LLC

(57) ABSTRACT

A fail-safe operating method for a decentralized power generation plant DG includes determining a leakage capacitance of a generator of the DG before connecting the DG. The method also includes comparing the determined leakage capacitance with a predetermined first limit value, and connecting the DG to a grid only if the determined leakage capacitance is smaller than the predetermined first limit value. A decentralized power generation plant is configured to perform the method.

19 Claims, 2 Drawing Sheets

Related U.S. Application Data continuation of application No. PCT/EP2018/083229, filed on Nov. 30, 2018.

(51) Int. Cl.
    *G01W 1/10*     (2006.01)
    *H02J 3/00*     (2006.01)

(56) References Cited

U.S. PATENT DOCUMENTS

| | | | |
|---|---|---|---|
| 2011/0062787 A1* | 3/2011 | Pan | H05B 47/11 |
| | | | 362/183 |
| 2011/0221281 A1* | 9/2011 | Miyamoto | H02M 1/32 |
| | | | 307/151 |
| 2013/0099571 A1 | 4/2013 | Bremicker | |
| 2013/0300428 A1* | 11/2013 | Bettenwort | G01R 31/52 |
| | | | 324/509 |
| 2014/0097854 A1 | 4/2014 | Hermeling | |
| 2015/0091546 A1* | 4/2015 | Adelhelm | H02S 50/10 |
| | | | 324/76.11 |
| 2016/0263923 A1 | 9/2016 | Bremicker | |
| 2016/0377670 A1* | 12/2016 | Tamida | G01R 31/52 |
| | | | 324/551 |
| 2020/0251898 A1 | 8/2020 | Bamberger | |

FOREIGN PATENT DOCUMENTS

| | | | |
|---|---|---|---|
| KR | 20130049095 A | * | 5/2013 |
| WO | 2012098677 A1 | | 7/2017 |

OTHER PUBLICATIONS

Non-Final Office Action dated Aug. 16, 2021 for U.S. Appl. No. 16/893,276.

Notice of Allowance dated Feb. 16, 2022 for U.S. Appl. No. 16/893,276.

\* cited by examiner

FAIL-SAFE OPERATING METHOD FOR A DECENTRALIZED POWER GENERATION PLANT

CROSS REFERENCE TO RELATED APPLICATIONS

This application is a continuation of U.S. patent application Ser. No. 16/893,276, filed on Jun. 4, 2020, which is a continuation of International Patent Application number PCT/EP2018/083229, filed on Nov. 30, 2018, which claims priority to German Patent Application number 10 2017 129 083.4, filed on Dec. 6, 2017, and is hereby incorporated by reference in its entirety.

FIELD

The disclosure relates to an operating method for a decentralized power generation plant with the aim of avoiding unnecessary shutdown of the decentralized power generation plant due to an excessive residual current, and a decentralized power generation plant configured to perform this method.

BACKGROUND

Decentralized power Generation plants (hereinafter referred to as DGs), in particular photovoltaic plants, are often equipped with a residual current circuit breaker that disconnects a connection of the DG to a grid if a difference between the sum of the currents flowing out of the DG and the sum of the currents flowing into the DG exceeds a limit value. Such a limit value excess of the residual current may be caused by inadequate insulation of the live components from the earth potential and may be due to accidental contact with a live line by a person, for example. Often it is required by standards that after the system has been switched off, the system may only be switched on after it has been checked by maintenance personnel, so that the system cannot feed energy into the grid for a long period of time after being switched off, even if another cause has caused the system to be switched off and a safe reconnection to the grid would be possible.

At the same time, especially in the case of transformerless inverters as part of a DG, the connecting lines to a generator of the DG show a variation of the line potential with respect to earth due to the design, so that a grid-frequency leakage current component arises which depends on the level of the leakage capacity of the generator with respect to earth. At a high value of the leakage capacitance, the grid frequency leakage current component can assume an amplitude which leads to an early tripping of the residual current circuit breaker. The value of the leakage capacitance depends on the size of the generator as well as on the way it is installed and is also strongly dependent on the weather conditions. Especially in wet conditions, the leakage capacitance of a DG rises sharply and can cause the residual current circuit breaker to trip regularly under these weather conditions due to high leakage currents, which are incorrectly detected as impermissible residual currents, and thus trip the residual current circuit breaker unnecessarily.

Therefore, various approaches exist to avoid the described premature tripping of the residual current circuit breaker. For example, GB 2 258 095 A proposes to divide the residual current into a direct current component, a first line-frequency current component which is in phase with a frequency of the grid, and a second line-frequency leakage current component which is 90° out of phase with a frequency of the grid. Different threshold values are assigned to the different components. If these values are exceeded, the DG disconnects from the grid.

In contrast, EP 0 878 850 A2 proposes to design an installation only in such a way that the leakage capacity of the generator of a DG does not exceed a predetermined value calculated from a trip threshold of a residual current circuit breaker. This limits the size of the generator and thus the system output.

Another known solution is to feed a grid frequency compensation current into one of the grid supply lines monitored by a residual current sensor of the residual current circuit breaker, which compensates the grid frequency leakage current component, or to impress the compensation current into an additional line or winding passing through the residual current sensor. The compensation current must be adapted to the respective operating state of the system by means of a control device.

In the light of the known state of the art, there is a need for a cost-effective and reliable residual current monitoring system that is robust against weather-induced false tripping of the residual current circuit breaker and does not unnecessarily restrict the design of the DG.

SUMMARY

A fail-safe operating method for a decentralized power generation plant DG comprises determining a leakage capacitance of a generator of the DG before connecting the DG to a grid, comparing the determined leakage capacitance with a predetermined first limit value, and connecting the DG to the grid only if the determined leakage capacitance is smaller than the predetermined first limit value.

Due to the conditional connection to the grid, a line-frequency leakage current component caused by the leakage capacitance remains limited in such a way that it remains small compared to the threshold value at which a residual current circuit breaker trips and disconnects the DG from the grid. The condition ensures that in operating situations in which the leakage current component represents a significant portion of the tripping threshold—thus significantly reducing the shutdown margin so that the probability is high that the residual current circuit breaker will trip unnecessarily—the DG remains disconnected from the grid and does not switch on until the condition is fulfilled again. In practice, it has been found that the loss of yield caused by the DG remaining temporarily disconnected from the grid when the condition is not met is small compared to the loss of yield caused by an unnecessary trip of the residual current circuit breaker due to a system shutdown until the DG is manually tested.

At the same time, it is not necessary to elaborately compensate or otherwise take into account this leakage current component when determining a residual current. The residual current circuit breaker can therefore be designed in a less complex way. A premature and unnecessary triggering of the residual current circuit breaker is nevertheless prevented by using the condition according to the disclosure.

After connecting the DG to the grid, the determination of a capacitive leakage current component of the residual current of the DG into the grid can be determined continuously or repeatedly. If the determined capacitive leakage current component exceeds a second limit value, the DG can be temporarily disconnected from the grid again. A renewed connection of the DG at a later time can be carried out in particular by using the inventive operating method described above.

As an alternative to disconnecting the DG from the grid, however, exceeding the second limit value by the capacitive leakage current component can instead cause the generator voltage of the DG generator to be temporarily reduced. Although this does not necessarily lead to a reduction of the capacitive leakage current, it does lead to a reduction of an additional current flowing via an insulation resistance, so that the probability of unnecessary tripping of the residual current circuit breaker is reduced by this measure as well. As a result, the DG can continue to produce energy and the capacitive leakage current component can be continuously monitored during operation of the DG, so that the measure of reduced generator voltage can be immediately cancelled again if the voltage falls below the second limit value. The loss of yield due to the required countermeasure can thus be kept low. However, if the capacitive leakage current continues to rise, the DG can of course be disconnected from the grid before the residual current circuit breaker trips.

In an advantageous implementation of the method according to the disclosure, the second limit value can be chosen to be less than or equal to half of a nominal tripping threshold of the residual current circuit breaker of the DG. In this way, it can be ensured that the residual current circuit breaker does not trip exclusively on the basis of the capacitive leakage current component during operation of the DG without an insulation residual being present, even if the residual current circuit breaker has an individual tripping threshold that is permissibly below the nominal tripping threshold.

In one embodiment, the leakage capacitance is determined together with the insulation resistance of the generator. The DG has an insulation monitoring system for this purpose. For example, a voltage amplitude with a measuring frequency, which can also deviate from the grid frequency, is applied between a connection of the generator and a reference potential, for example, an earth potential. By measuring the current caused by this, the insulation monitoring can jointly determine both, the insulation resistance and the leakage capacitance.

To determine the leakage capacitance, at least two voltage values can be specified on connecting lines of the generator of the DG by means of an inverter bridge of an inverter of the DG. The currents or current transients caused by the two voltage values can be used to determine the leakage capacitance. The specification of a sinusoidal voltage curve using the inverter bridge in one example.

In an advantageous variant of joint determination of leakage capacitance and insulation resistance, the neutral conductor connection of the inverter is connected to the neutral conductor of the grid, while the phase connections remain separate. Subsequently, a voltage of a predetermined amplitude and frequency can be applied to the generator connections via a suitable control of the inverter bridge. The resultant current can be measured with already present current sensors and evaluated to determine the leakage capacitance and insulation resistance.

This method can also be used to test the tripping threshold of the residual current circuit breaker by increasing the amplitude of the voltage specified with the inverter bridge stepwise or continuously until the residual current circuit breaker trips, for example, using the grid frequency as the measuring frequency. The amplitude of the current caused by the voltage when the residual current circuit breaker is tripped determines the tripping threshold of the residual current circuit breaker. Provided that it is ensured that the DG has a sufficiently high insulation resistance when carrying out this method, and thus the resultant current contains only the capacitive leakage current component, the tripping threshold corresponds to the current amplitude when the residual current circuit is tripped.

In one embodiment, preference is given to the second limit value being determined as a function of the tripping threshold thus determined, in particular by reducing the second limit value by a predetermined amount or a predetermined percentage compared with the determined tripping threshold.

In a further advantageous variant of the method according to the disclosure, an unnecessary tripping of the residual current circuit breaker during operation of the DG is reacted to by an adjustment of the first limit value by lowering the first limit value depending on a difference between the leakage capacitance determined during the last connection of the DG to the grid and the previous first limit value. In one embodiment, the first limit value can be lowered by the entire difference or by a specified percentage of this difference. In this way, it is possible to react to an unnecessary trip of the residual current circuit breaker due to an inappropriately high first limit value by automatically reducing the first limit value to a sufficiently low value to prevent unnecessary trip of the residual current circuit breaker.

To further improve the method, current weather data and/or weather forecast data can be taken into account. For example, the first limit value can be selected depending on the weather and/or weather forecast data. In this way, the method can take into account a weather-related change in the leakage capacitance determined at the time of switching on during the course of the expected operating time of the DG and, for example, refrain from switching on the DG if the leakage capacitance has already almost reached the first limit value and a further increase in the leakage capacitance is foreseeable due to the onset of precipitation.

As an alternative to not connecting the DG to the grid, the current weather data and/or weather forecast data can also be taken into account by the DG first connecting to the grid, but already setting a time at which it will disconnect from the grid again. This point in time corresponds to the time of a forecast weather change that is expected to result in a critical increase in the leakage capacitance. This method can be chosen, for example, if the leakage capacitance determined when the device is connected is less than a specified distance value below the first limit value.

In another embodiment, the disclosure includes a DG set up to perform the operating method described above. By using this method, it is possible to also use such residual current sensors within the residual current circuit breaker in which no compensation of a capacitive leakage current component takes place. Nevertheless, it is possible to reliably prevent tripping of the residual current circuit breaker due to an excessive leakage current component.

Advantageously, the DG includes an insulation monitoring system that is adapted for the joint determination of an insulation resistance and the leakage capacitance of a generator of the DG.

BRIEF DESCRIPTION OF THE DRAWINGS

In the following, the disclosure is represented by means of figures, of which

DETAILED DESCRIPTION

Figure 1:
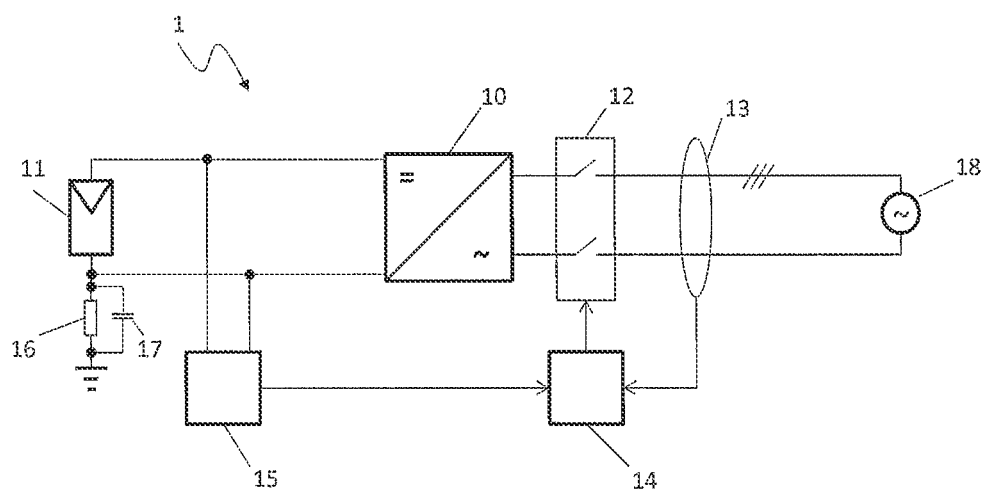
FIG. 1 shows an embodiment of a DG according to the disclosure.

FIG. 1 shows a DG 1, which is designed as a photovoltaic system with an inverter 10, wherein the inverter 10 converts the direct current of a generator 11 into a grid-compliant alternating current for feeding into a grid 18 via grid connection lines by means of an inverter bridge. A grid relay 12 is arranged in the grid connection lines of the DG 1, which is controlled by a residual current circuit breaker 14. The residual current circuit breaker 14 is connected to a residual current sensor 13 which detects a residual current on the grid connection lines and compares it with a threshold value. If the threshold value is exceeded, the grid relay 12 is opened to disconnect the inverter 10 from the grid 18.

Furthermore, the DG 1 has an insulation monitoring circuit, sensor or device 15 on the connection lines of the inverter 10 to the generator 11, which is configured to determine the value of an insulation resistance 16 and the value of a leakage capacitance 17 of the generator 11 with respect to an earth potential before the DG 1 is connected to the grid 18 and/or during operation of the DG 1. The insulation resistance and the leakage capacitance are not real components, but should represent the electrical properties of the DG as an equivalent circuit diagram and can also be connected at any other point of the generator 11.

Depending on the values of the insulation resistance 16 and the leakage capacitance 17 determined in this way, the insulation monitoring device 15 transmits a signal to the residual current circuit breaker 14, which is used to control the grid relay 12. In one embodiment, it is provided that if the insulation resistance 16 falls below a minimum insulation resistance or if the leakage capacitance 17 exceeds a maximum leakage capacitance, the grid relay 12 is not closed or is opened if it is closed.

Figure 2:
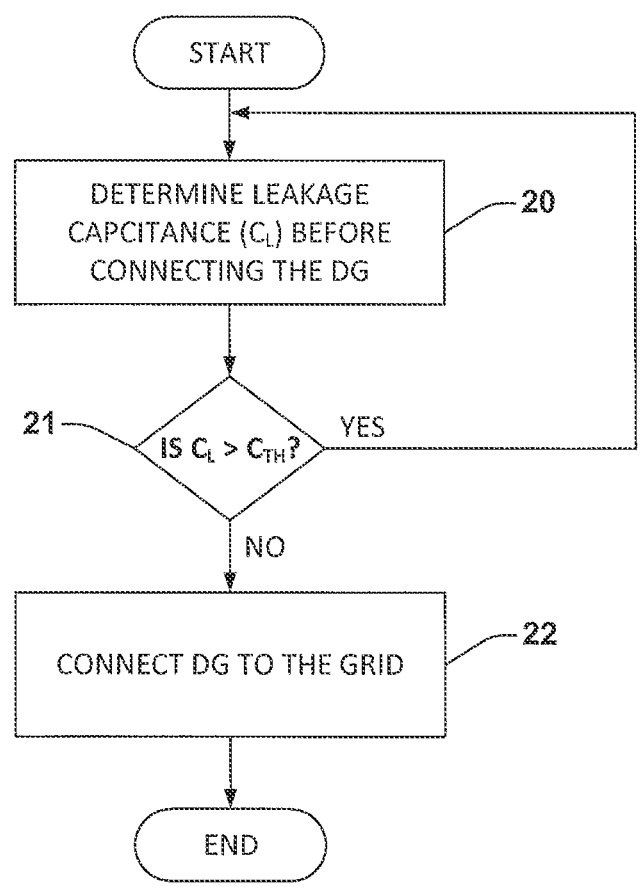
FIG. 2 shows a flow chart of an operating method according to the disclosure.

FIG. 2 shows an inventive operating method for a DG such as the DG 1 shown in FIG. 1 In a first act 20, the leakage capacitance ($C_L$) of a generator in the DG is determined at the beginning of the method before connecting the DG. In a second act 21, the value of the leakage capacitance ($C_L$) determined in this way is compared with a predetermined first limit value ($C_{TH}$) and, if it is exceeded (YES at 21), the DG branches back to the beginning of the method and the determination of the leakage capacitance is repeated at a later point in time without the DG being connected to the grid.

In a third act 22, the DG is connected to the grid if the determined leakage capacitance is less than or equal to the specified limit value (NO at 21).

The third act 22 can be followed by further procedural acts after the DG has been commissioned, in which the leakage capacitance continues to be monitored. For example, after connecting the DG to the grid, a capacitive leakage current component of a residual current of the DG can be determined continuously or repeatedly and, if a second limit value is exceeded by this leakage current component, the system can be disconnected from the grid or alternatively a generator voltage of the generator can be reduced.

Furthermore, cases of tripping of the residual current circuit breaker of the DG can be evaluated to the effect that the first or second limit value is suitably adjusted if unnecessary shutdowns continue to occur due to an excessively high capacitive leakage current component.

Alternatively or additionally, the second limit value can be determined suitably with the following acts: first, a capacitive leakage current component is determined at which the residual current circuit breaker trips. The value of this component is determined in one embodiment under the condition that no other leakage current components are present. Then the second limit value is determined as a value reduced by a predetermined amount or by a predetermined percentage compared to the tripping capacitive leakage current component.

Furthermore, the first limit value can be selected depending on current weather data and/or weather forecast data. In this way it can be taken into account to what extent the leakage capacitance can vary due to weather conditions compared to a leakage capacitance determined at the time of connection to the grid, in order to be able to estimate the possibility of increasing the leakage capacitance to a value critical for residual current disconnection in the course of the operating period (usually the remaining day). In this way, it can be decided to waive the yield of the installation on the day in question, in order to avoid the effort of manually resetting the residual current circuit breaker. It is also conceivable to provide for suitable measures to avoid a residual current related shutdown of the DG, for example its temporary disconnection from the grid, within a period determined by the weather forecast.

The invention claimed is:

1. A method of operating a decentralized power generation plant (DG), comprising:
    prior to connecting the DG to a grid, applying at least two voltage values to connecting lines of a generator of the DG,
    determining a leakage capacitance of the generator of the DG based on currents or current transients caused by the application of the at least two voltage values, and
    selectively connecting the DG to the grid based on the determined leakage capacitance.

2. The method according to claim 1, wherein the at least two voltage values are applied by an inverter bridge of the DG.

3. The method according to claim 1, wherein selectively connecting the DG to the grid comprises connecting the DG to the grid only when the determined leakage capacitance is smaller than a predetermined first limit value.

4. The method according to claim 1, wherein determining the leakage capacitance is carried out together with determining an insulation resistance of the generator.

5. The method according to claim 3, wherein after connecting the DG to the grid, the method further comprises:
    determining a capacitive leakage current component of a residual current of the DG continuously or repeatedly, and
    disconnecting the DG from the grid when the determined capacitive leakage current component exceeds a second limit value.

6. The method according to claim 5, wherein the second limit value is selected to be less than or equal to half of a nominal tripping threshold of a residual current circuit breaker of the DG.

7. The method according to claim 5, wherein after connecting the DG to the grid, the method further comprises:
    determining a capacitive leakage current component of a residual current of the DG continuously or repeatedly, and
    reducing a generator voltage of the generator when the capacitive leakage current component exceeds the second limit value.

8. The method according to claim 7, wherein the second limit value is determined by:
   determining a capacitive leakage current component at which a residual current circuit breaker of the DG trips, and
   determining the second limit value to be a value reduced by a predetermined amount or by a predetermined percentage compared to the capacitive leakage current component at which the residual current circuit breaker of the DG trips.

9. The method according to claim 7, wherein the second limit value is selected to be less than or equal to half of a nominal tripping threshold of a residual current circuit breaker of the DG.

10. The method according to claim 3, further comprising:
   lowering the predetermined first limit value in response to a trip event of a residual current circuit breaker of the DG as a function of a difference between leakage capacitance determined prior to the trip event and an initial first limit value.

11. The method according to claim 3, wherein the first limit value is selected based on current weather data and/or weather forecast data.

12. The method according to claim 3, wherein in a case of connection to the grid and when the determined leakage capacitance is below the first limit value by less than a predetermined amount, selecting a time at which the DG is disconnected from the grid again based on current weather data and/or weather forecast data.

13. A decentralized power generation plant (DG), comprising:
   an insulation monitoring circuit configured to perform an act of determining a value of a leakage capacitance of a generator of the DG, wherein the determining is based on currents or current transients caused by an application of at least two voltage values to connecting lines of a generator of the DG, and
   a residual current circuit breaker coupled to the insulation monitoring circuit and configured to perform an act of selectively connecting the DG to a grid via a grid relay based on the determined leakage capacitance value to ensure that the DG remains disconnected from the grid when the determined leakage capacitance satisfies a predetermined criteria.

14. The DG according to claim 13, wherein the residual current circuit breaker is configured to perform the act of selectively connecting the DG to the grid via the grid relay by ensuring that the grid relay is open when the determined leakage capacitance satisfies the predetermined criteria.

15. The DG according to claim 14, wherein the predetermined criteria being satisfied comprises the determined leakage capacitance exceeding a predetermined threshold.

16. The DG according to claim 13, further comprising a residual current sensor configured to perform an act of determining a residual current on connection lines that couple the DG to the gird.

17. The DG according to claim 16, wherein the residual current sensor is uncompensated with respect to a leakage capacitance sensor of the insulation monitoring circuit.

18. The DG according to claim 16, wherein the residual current circuit breaker is configured to open the grid relay if the residual current determined by the residual current sensor exceeds a maximum residual current value.

19. The DG according to claim 13, wherein the insulation monitoring circuit is further configured to perform the act of jointly determining an insulation resistance and the leakage capacitance of the generator.

* * * * *